United States Patent [19]

Ibuchi

[11] Patent Number: 4,965,622
[45] Date of Patent: Oct. 23, 1990

[54] IMAGE FORMING APPARATUS

[75] Inventor: Yoshiaki Ibuchi, Nari, Japan

[73] Assignee: Sharp Kabushiki Kaisha, Osaka, Japan

[21] Appl. No.: 391,287

[22] Filed: Aug. 8, 1989

[30] Foreign Application Priority Data

Aug. 8, 1988 [JP] Japan .................................. 63-197637
Sep. 5, 1988 [JP] Japan .................................. 63-221546
Sep. 29, 1988 [JP] Japan ........................... 63-127793[U]

[51] Int. Cl.$^5$ ............................................. G03B 27/32
[52] U.S. Cl. ......................................... 355/27; 355/72
[58] Field of Search ....................... 355/27, 28, 72, 75; 354/83, 85, 86, 21; 242/71, 71.1

[56] References Cited

U.S. PATENT DOCUMENTS 4,624,560 11/1986 Beery .................................... 355/27
4,914,479 4/1990 Ogura .................................. 355/213

FOREIGN PATENT DOCUMENTS 5888739 1/1982 Japan .

Primary Examiner—Michael L. Gellner
Assistant Examiner—Khanh Dang
Attorney, Agent, or Firm—Irell & Manella

[57] ABSTRACT

An image forming apparatus comprising a photosensitive sheet cartridge in which the photosensitive sheet is accommodated in a rolled form, a leader sheet being connected to the leading edge of the photosensitive sheet and numerous positioning holes being provided at regular intevals on both sides of the leader sheet in the longitudinal direction of the photosensitive sheet; the body of the image forming apparatus onto which the photosensitive sheet cartridge is detachably mounted; and a guide roller for transporting the photosensitive sheet, which is drawn from the photosensitive sheet cartridge, toward the pair of pressure rollers when the cartridge is installed into the body of the image forming apparatus, the guide being provided with guide protrusions, at regular intervals on the outer surface thereof, which engage with the positioning holes of the leader sheet, thereby providing an image forming apparatus that is capable of easily and accurately loading into the body of the image forming apparatus a photosensitive sheet drawn out of a photosensitive sheet cartridge mounted in the body of the image forming apparatus without creasing or damaging the photoconductor sheet.

9 Claims, 10 Drawing Sheets

IMAGE FORMING APPARATUS

BACKGROUND OF THE INVENTION

1. Field of the invention

The present invention relates to an image forming apparatus for forming an image by using a photosensitive sheet coated with microcapsules containing photohardening materials and coloring dyes and an image receiving sheet coated with developer which reacts with the coloring dyes to develop colors. More particularly, the invention relates to an image forming apparatus wherein the photosensitive sheet is wound on a roll and is accommodated in a photosensitive sheet cartridge, the photosensitive sheet cartridge being mounted in the image forming apparatus in a detachable way.

2. Description of the prior art

Japanese Laid-Open Patent Publication No. 58-88739 discloses an image forming method using a photosensitive sheet coated with microcapsules containing photohardening materials and coloring dyes and an image receiving sheet coated with developer which reacts with the coloring dyes to develop colors.

The formation of an image according to the above method is carried out as follows: when the light of an original image is projected onto the photosensitive sheet, the microcapsules harden selectively where the light strikes, forming a latent image thereon corresponding to the original image. Then, the image receiving sheet coated with developer is superimposed and pressed on the photosensitive sheet on which the latent image has been formed. This causes the unhardened microcapsules to rupture, and therefore, the coloring dyes contained therein to flow out to react with the developer on the image receiving sheet to develop colors, thus forming on the image receiving sheet an image corresponding to the original image.

In an image forming apparatus using an image forming method such as that described above, the photosensitive sheet exposed to the light from the original image is passed, with the image receiving sheet superposed thereon, between a pair of pressure rollers, thereby forming an image on the image receiving sheet. To prevent the microcapsules from rupturing by an external force or hardening by exposure to external light before exposure to the original image, the photosensitive sheet used in the image forming apparatus is accommodated in a rolled form in a photosensitive sheet cartridge which is mounted in the image forming apparatus before use. When the photosensitive sheet cartridge is mounted in the image forming apparatus, it is necessary to draw the photosensitive sheet out of the photosensitive sheet cartridge and feed it through an exposure section and then between a pair of pressure rollers while it is transported in a transport path by means of transport rollers, i.e. to load the photosensitive sheet. Therefore, if the photosensitive sheet is not aligned properly in the transport path, smooth transport of the sheet is hampered, and the photosensitive sheet may be creased or broken, or in some cases, may jam in the transport path. If the creased or broken photosensitive sheet is fed between the pressure rollers, the rollers bind because of increased loads applied thereto. As a matter of course, with the creased or broken photosensitive sheet, it is not possible to form a good image. Thus, the image forming apparatus does not function properly unless the photosensitive sheet is properly loaded.

The photosensitive sheet is made of a very thin material with low rigidity such as a polyethylene terephthalate sheet with a thickness of 25 $\mu$m. Utmost care is therefore required in manual loading of the photosensitive sheet onto the transport rollers, etc., in the transport path so as not to crease or damage it. In particular, in order to pass the photosensitive sheet without creating creases between the pressure rollers to which great pressure is applied, the pressure being applied to the pressure rollers must first be released, which requires extremely troublesome work. Moreover, it is not easy work to set the pressure rollers back to the specified pressure once it is released. Passing the photosensitive sheet without creating creases between the pressure rollers to which great pressure is applied may be accomplished by passing it with reference to the contact line between the pressure rollers, but passing the photosensitive sheet with reference to the contact line between the pressure rollers requires a highly skilled technique, which is only possible with a skilled operator, and hardly possible with ordinary users of the image forming apparatus.

SUMMARY OF THE INVENTION

The image forming apparatus of this invention, which overcomes the above-discussed and numerous other disadvantages and deficiencies of the prior art, is an image forming apparatus in which a photosensitive sheet coated with microcapsules containing photohardening materials and coloring dyes is exposed to light from the original image and then pressed, with an image receiving sheet coated with developer, between a pair of pressure rollers, resulting in an image on said image forming sheet, said apparatus comprises: a photosensitive sheet cartridge in which said photosensitive sheet is accommodated in a rolled form, a leader sheet being connected to the leading edge of said photosensitive sheet and numerous positioning holes being provided at regular intervals on both sides of said leader sheet in the longitudinal direction of said photosensitive sheet, the body of said image forming apparatus onto which said photosensitive sheet cartridge is detachably mounted, and a guide roller for transporting said photosensitive sheet, which is drawn from said photosensitive sheet cartridge, toward said pair of pressure rollers when said cartridge is installed into the body of said image forming apparatus, said guide being provided with guide protrusions, at regular intervals on the outer surface thereof, which engage with said positioning holes of said leader sheet.

In a preferred embodiment, the leader sheet has a greater rigidity than said photosensitive sheet.

In a preferred embodiment, a sheet holding means is disposed facing said guide roller so as to be moved to engage with and disengage from said guide roller, said sheet holding means acting to press on said guide roller said leader sheet, the positioning holes which are engaged with said guide protrusions of said guide roller, when said sheet holding means is moved toward said guide roller.

In a preferred embodiment, a bucket where the photosensitive sheet cartridge is mounted is disposed in the body of said image forming apparatus so that it is drawn from and installed into the body of said image forming apparatus in the horizontal position.

In a preferred embodiment, the bucket is drawn from the body of said image forming apparatus by opening a cover provided on one side of the body of said image forming apparatus.

In a preferred embodiment, the guide roller is disposed in said bucket.

In a preferred embodiment, the body of said image forming apparatus comprises an auto loading means by which said leader sheet, the positioning holes of which are engaged with the guide protrusions of said guide roller, is transported toward said pair of pressure rollers so as to achieve an auto loading of said photosensitive sheet into the body of said image forming apparatus.

In a preferred embodiment, the auto loading means operates at the time when it is detected that not only said bucket has been set into the body of said image forming apparatus but that said photosensitive sheet cartridge has been set into said bucket.

In a preferred embodiment, the auto loading means operates at the time when it is detected that not only said cover has been closed but that said photosensitive sheet cartridge has been set into said bucket.

In the image forming apparatus of the present invention, the leader sheet is first drawn out of the photoconductor sheet cartridge, and then the positioning holes provided in both sides of the leader sheet are engaged with the guide protrusions provided on the guide roller in the image forming apparatus. Then, being guided by the guide protrusions, the leader sheet is fed between the pressure rollers in the properly aligned state. As a result, the photoconductor sheet led by the leader sheet is correctly transported between the pressure rollers, thus accomplishing the loading of the photosensitive sheet in the properly aligned state.

Since the leader sheet has a greater rigidity than the photosensitive sheet, the leader sheet is properly transported to the pressure rollers without jamming, and therefore, the photosensitive sheet led by the leader sheet is also properly transported through the pressure rollers without jamming.

The photosensitive sheet cartridge is mounted in a bucket which is slid out of the image forming apparatus. When the bucket with the photosensitive sheet mounted therein is set in the image forming apparatus, the leader sheet is drawn out of the photosensitive sheet cartridge, automatically loading the photosensitive sheet into the image forming apparatus.

The auto loading of the photosensitive sheet is initiated with the bucket set in the image forming apparatus and with the cover of the image forming apparatus closed.

Thus, the invention described herein makes possible the objectives of (1) providing an image forming apparatus that is capable of easily and accurately loading into the body of the image forming apparatus a photosensitive sheet drawn out of a photosensitive sheet cartridge mounted in the body of the image forming apparatus without creasing or damaging the photoconductor sheet;

(2) providing an image forming apparatus that is capable of easily mounting the photosensitive sheet cartridge in the body of the image forming apparatus; and (3) providing an image forming apparatus that is capable of automatically loading the photosensitive sheet into the body of the image forming apparatus in a very safe manner.

DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

EXAMPLE 1

Figure 1:
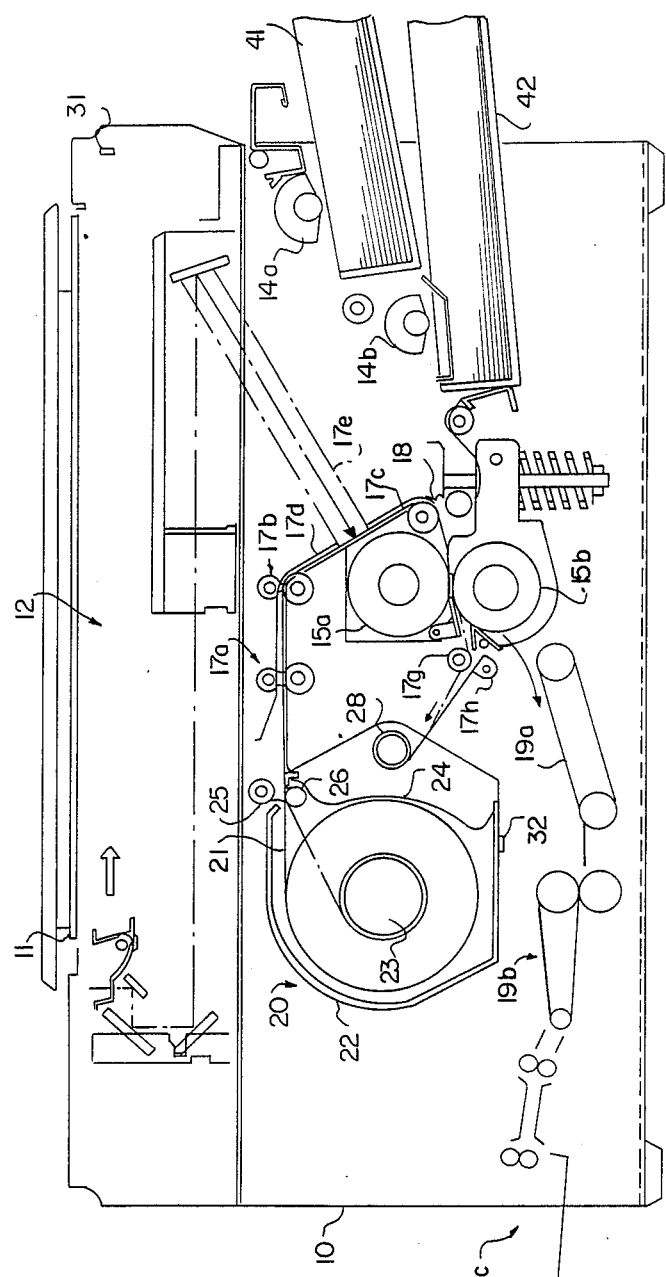
FIG. 1; is a schematic view showing a copying machine of the image forming apparatus of the present invention.

FIG. 1 shows the construction of a copying machine of the image forming apparatus of the present invention. On the top surface of the body 10 of the copying machine is mounted an original table 11, beneath which is disposed an optical unit 12 comprising a light source, a plurality of reflecting mirrors, a lens, etc. The optical unit 12 illuminates and scans an original placed on the original table 11 by moving its light source, etc., along the original table 11. The light reflected from the original on the original table 11 is directed through the optical unit 12 to the middle part of the copying machine body 10. In the middle part of the copying machine body 10 are disposed a pair of pressure rollers 15a and 15b one on top of the other, the light reflected from the original on the original table being directed through the optical unit 12 toward the surface of the upper pressure roller 15a. The lower pressure roller 15b is made to contact the upper pressure roller 15a by means of a pressure mechanism using a spring or the like with a force, for example, of about 90 kg/cm$^2$.

Before the pressure rollers 15a and 15b and in one side of the copying machine body 10, are detachably mounted two paper cassettes 41 and 42 one on top of the other. The paper cassettes 41 and 42 respectively hold image receiving sheets of different sizes. Paper feed rollers 14a and 14b are respectively disposed above the positions where the paper cassettes 41 and 42 are mounted in the copying machine body 10. The paper feed rollers 14a and 14b feed the image receiving sheet one by one from the paper cassettes 41 and 42 respectively toward the pressure position between the paired pressure rollers 15a and 15b. The paper feed roller 14a or 14b whichever selected is driven to feed the image receiving sheet from the paper cassette facing the paper feed roller being driven to the pressure position between the paired pressure rollers 15a and 15b.

A photosensitive sheet cartridge 20 is detachably mounted to the rear of the upper pressure roller 15a and opposite to the side of the copying machine body 10 where the paper cassettes 41 and 42 are mounted, the photosensitive sheet cartridge 20 having a casing 22 in which a photosensitive sheet 21 is accommodated in a rolled form. The casing 22 has an open side, the rolled photosensitive sheet 21 being mounted on a supply shaft 23 rotatably installed therein. A light shielding sheet 24 is attached to the casing 22 to cover the open end with a delivery exit 25 for the photosensitive sheet 21 formed therein when the photosensitive sheet 21 is mounted on the supply shaft 23. Therefore, the rolled photosensitive sheet 21 accommodated in the casing 22 is protected by the light shielding sheet 24 from premature exposure to light. Disposed at the delivery exit 25 for the photosensitive sheet 21 is a delivery roller 26, beneath which and outward of the light shielding sheet 24 a take-up roller 28 is rotatably installed.

The photosensitive sheet cartridge 20 is mounted in the copying machine body 10 with the front cover (not shown) of the copying machine body 10 opened. On the upper part of the side of the copying machine body 10 where the paper cassettes 41 and 42 are mounted, is disposed a cover sensor 31 for detecting the closed state of the front cover. The photosensitive sheet cartridge 20 is mounted in the copying machine body 10 in such a way that the take-up roller 28 faces the pressure roller 15a. The photosensitive sheet 21 is continuously delivered through the delivery exit 25. Also in the copying machine body 10, a cartridge sensor 32 for detecting if the photosensitive sheet cartridge 20 is mounted in the copying machine body 10 is disposed, for example, below the mounting position of the photosensitive sheet cartridge 20.

Figure 2:
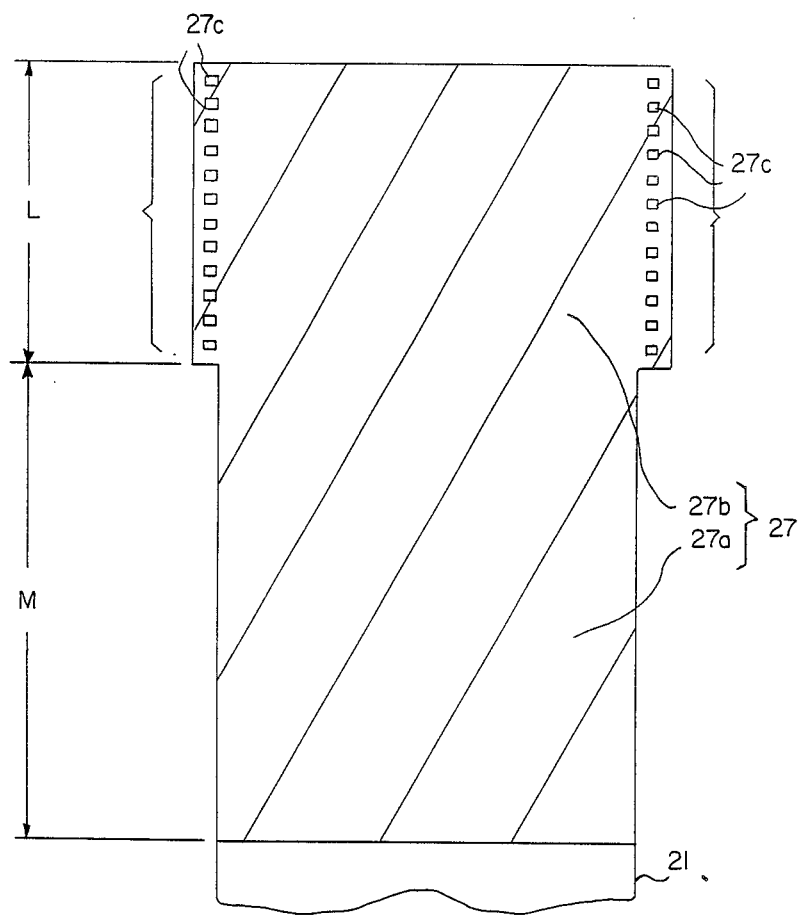
FIG. 2 is a plan view of a leader sheet connected to the leading edge of a photosensitive sheet used for the copying machine of FIG. 1.

The photosensitive sheet 21 accommodated in the casing 22 of the photosensitive sheet cartridge 20 is made for example from polyethylene terephthalate with a thickness of about 25 $\mu$m one side of which is coated with microcapsules containing photohardening materials and coloring dyes. To the leading edge of the photosensitive sheet 21 is connected to a leader sheet 27 as shown in FIG. 2. The leader sheet 27 has a thickness of about 100–250 $\mu$m, and is substantially thicker than the polyethylene terephthalate sheet used for the photosensitive sheet 21 The leader sheet 27 is made for example from a polyethylene terephthalate film of about 100 $\mu$m thickness. The leader sheet 27 is bonded to the leading edge of the photosensitive sheet 21 by fusing or other methods. The leader sheet 27 has the same width as that of the photosensitive sheet 21 at its trailing edge portion 27a which is bonded to the photosensitive sheet 21, and has a wider width at its leading edge portion 27b than the trailing edge portion 27a, the sides of the leading edge portion 27b slightly extending outwardly of the sides of the trailing edge portion 27a. On both sides of the leading edge portion 27b, numerous positioning holes 27c are provided at regular intervals in the longitudinal direction of the leader sheet. Originally, the leading edge of the leader sheet 27 is engaged with the delivery roller 26 disposed at the delivery exit 25 of the photosensitive sheet cartridge 20.

In the copying machine body 10, a transport roller 17a is disposed for transporting the photosensitive sheet 21, which is being delivered through the delivery exit 25 for the photosensitive sheet cartridge 20, toward the position above the pressure roller 15a. Above the pressure roller 15a, a transport roller 17b is disposed for transporting the photosensitive sheet 21, which is being transported by means of the transport roller 17a, by changing the feeding direction downward toward the exposure area onto which the light reflected from the original is projected. The photosensitive sheet 21 being transported by means of the transport roller 17b passes by the side of the upper pressure roller 15a, its feeding direction being reversed by a reversing guide roller 17c toward the pressing position between the paired pressure rollers 15a and 15b.

As shown in FIG. 1, along the transport path from the area between the delivery exit 25 for the photosensitive sheet 21 to the area adjacent to the reversing guide roller 17c, a transport guide 17d is so disposed as to cover the photosensitive sheet 21 being transported. The transport guide 17d is provided with an opening 17e in a portion corresponding to the exposure area where the light reflected from the original is projected, the light reflected from the original being projected through the opening 17e onto the photosensitive sheet 21, thus causing the microcapsules on the photosensitive sheet 21 to selectively harden to form a latent image thereon corresponding to the original image.

Figure 3:
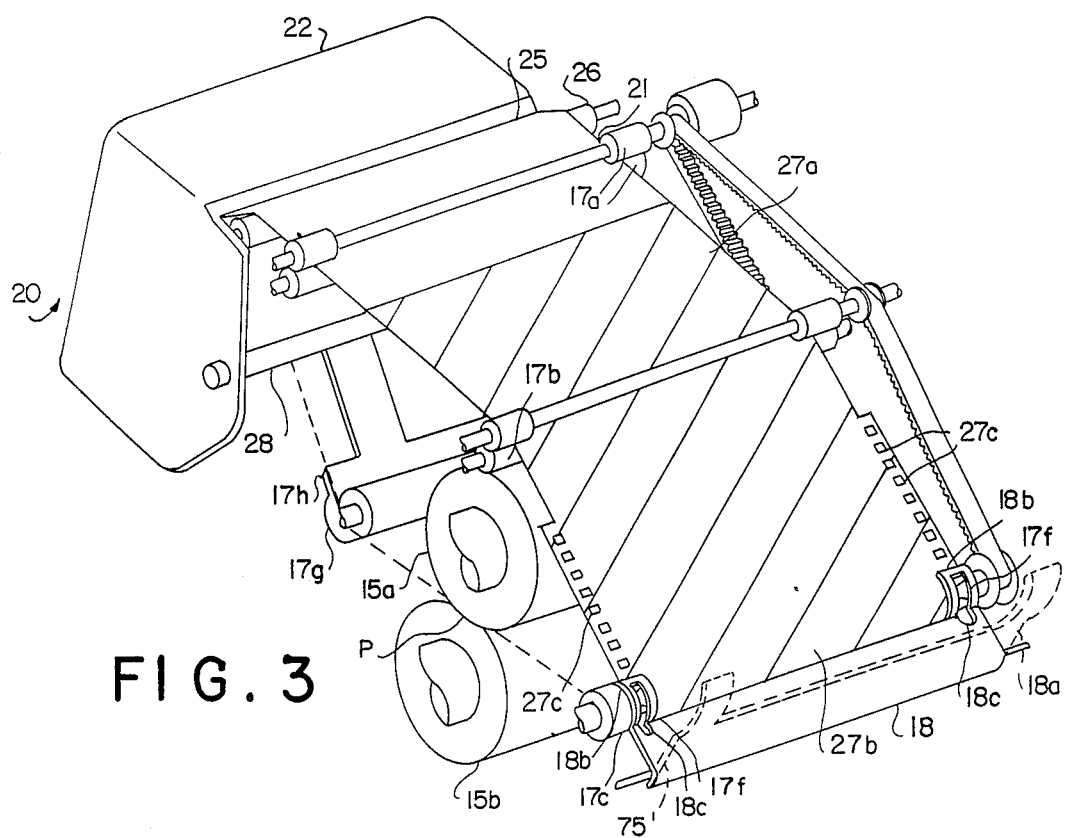
FIG. 3 is a perspective view showing the major section of a photosensitive sheet cartridge mounted in the copying machine.

The reversing guide roller 17c is provided, as shown in FIG. 3, with guide protrusions 17f at regular intervals on the outer surface thereof corresponding to each side of the photosensitive sheet 21 being transported. The guide protrusions 17f continuously engage with the aforementioned positioning holes 27c formed on both sides of the leading edge portion 27b of the leader sheet 27 bonded to the leading edge of the photosensitive sheet 21.

A sheet holding plate 18 is disposed facing the reversing guide roller 17c with the transport path for the leader sheet 27 and the photosensitive sheet 21 interposed therebetween. The sheet holding plate 18 is rotatably supported on a support shaft 18a in such a way that it can be moved to engage with and disengage from the reversing guide roller 17c. A pressing portion 18b is formed at each side of the sheet holding plate 18 to match the position of the guide protrusions 17f provided on the reversing guide roller 17c. Each pressing portion 18b is provided with a through hole 18c through which the guide protrusions 17f protrude. The pressing portions 18b are turned toward the reversing guide roller 17c to engage the through holes 18c with the guide protrusions 17f and to press on the reversing guide roller 17c the sides of the leading edge portion 27b of the leader sheet 27 which is transported with the positioning holes 27c engaged.

Being guided by the reversing guide roller 17c, the leader sheet 27 is transported toward the pressing position between the pressure rollers 15a and 15b, with the positioning holes 27c continuously engaging with the guide protrusions 17f on the reversing guide roller 17c. The leader sheet 27 is thus passed between the pressure rollers 15a and 15b. The photosensitive sheet 21 whose leading edge is connected to the leader sheet 27 is continuously transported, trailing behind the leader sheet 27, between the pressure rollers 15a and 15b.

Also transported to the pressing position between the paired pressure rollers 15a and 15b is an image receiving sheet which is fed from either paper cassette 41 or 42 synchronously with the transportation of the photosensitive sheet 21 on which a latent image is formed with hardened microcapsules. At the pressing position between the paired pressure rollers 15a and 15b, the image receiving sheet is pressed on the latent image areas on the photosensitive sheet 21, which causes unhardened microcapsules on the photosensitive sheet 21 to rupture allowing coloring dyes to flow out onto the image receiving sheet, the coloring dyes reacting with the developer on the image receiving sheet to develop colors. An image corresponding to the original image is thus formed on the image receiving sheet.

A transport roller 17g is disposed between the upper pressure roller 15a and the mounting position of the photosensitive sheet 21, and the leader sheet 27 and photosensitive sheet 21 passed between the paired presure rollers 15a and 15b are transported by means of the transport roller 17g toward the take-up roller 28 in the photosensitive sheet cartridge 20. Under the transport roller 17g, a transport guide 17h is disposed so as to face the transport roller 17g. The transport guide 17h properly guides the leader sheet 27 and photosensitive sheet 21 to the take-up roller 28 in the photosensitive sheet cartridge 20.

The leader sheet 27 passed between the paired pressure rollers 15a and 15b is transported by means of the transport roller 17g, while being guided by the transport guide 17h, to the take-up roller 28 in the photosensitive sheet cartridge 20, the take-up roller 28 taking up the leader sheet 27. The photosensitive sheet 21 led by the leader sheet 27 is then continuously taken up on the take-up roller 28.

Beneath the mounting position of the photosensitive sheet cartridge 20, a transport belt 19a is provided which transports the image receiving sheet passed between the pressure rollers 15a and 15b, and downstream of the transporting direction thereof is provided an image glossing unit 19b which heats the image formed on the image receiving sheet to give glossiness to the image while the image receiving sheet is being transported. The image receiving sheet transported by the image glossing unit 19b is discharged to an paper exit tray 19c.

With a copying machine of the above construction, the photosensitive sheet cartridge 20 is mounted in the copying machine body 10 before starting the copy operation. The photosensitive sheet cartridge 20 is mounted in the copying machine body 10 with the front cover opened. The photosensitive sheet cartridge 20 accommodates the photosensitive sheet 21 in a rolled form in the casing 22, the leading edge of the leader sheet 27 connected to the leading edge of the photosensitive sheet 21 being engaged with the delivery roller 26 in the delivery exit 25. The light shielding sheet 24 covers the open side of the casing 22, except the delivery exit 25 to which the leader sheet 27 is fastened, thus allowing hardly any external light to enter the casing 22. Furthermore, the rolled photosensitive sheet 21 accommodated in the casing 22 is covered with the leader sheet 27 wound therearound, thus preventing the photosensitive sheet 21 from being exposed to the light from outside the casing 22.

When the photosensitive sheet cartridge 20 is mounted in the specified position in the copying machine body 10, the cartridge sensor 32 is activated, and the leader sheet 27 is drawn out through the delivery exit 25 of the photosensitive sheet cartridge 20. The leader sheet 27 drawn out through the delivery exit 25 is continuously applied on the transport rollers 17a and 17b, and is transported along the transport guide 17d. Then, the leading edge portion 27b of the leader sheet 27 is wound on the reversing guide roller 17c. At this point of time, the sheet holding plate 18 facing the reversing guide roller 17c is turned away from the reversing guide roller 17c. The positioning holes 21c formed in both sides of the leading edge portion 27b of the leader sheet 27 are then engaged with the guide protrusions 17f provided on the reversing guide roller 17c. After that, the sheet holding plate 18 is turned toward the reversing guide roller 17c to engage the through holes 18c formed in the pressing portions 18b of the sheet holding plate 18 with the guide protrusions 17f on the reversing guide roller 17c, thus pressing the pressing portions 18b onto the sides of the leader sheet 27 wound on the reversing guide roller 17c.

With the above operation completed, the front cover of the copying machine body 10 is closed activating the front cover sensor 31 provided on the side of the upper part of the copying machine body 10, the cartridge sensor 32 remaining on, thus making auto loading of the photosensitive sheet 21 ready to start. When the auto loading is started, the reversing guide roller 17c is first driven to feed the leader sheet 27, being guided by the guide protrusions 17f, to the pressing position between the paired pressure rollers 15a and 15b where the leader sheet 27 is made to pass. The leading edge portion 27b of the leader sheet 27 passed between the paired pressure rollers 15a and 15b is transported by means of the transport roller 17g and transport guide 17h to be taken up on the take-up roller 28 in the photosensitive sheet cartridge 20. As the leader sheet 27 is taken up on the take-up roller 28, the photosensitive sheet 21 whose leading edge is bonded to the leader sheet 27 is continuously delivered from the photosensitive sheet cartridge 20, being transported on the transport rollers 17a and 17b and on the reversing guide roller 17c, and is made to pass between the pressure rollers 15a and 15b. Since the photosensitive sheet 21 has a narrower width than the leading edge portion 27b of the leader sheet 27, the photosensitive sheet 21 is positioned on the reversing guide roller 17c between the portions thereof provided with the guide protrusions 17f so as not to touch the guide protrusions 17f which engage with the positioning holes 27c in both ends of the leading edge portion 27b. The photosensitive sheet 21 is transported by means of the transport roller 17g and transport guide 17h to be taken up on the take-up roller 28. The photoconductor sheet 21 is thus automatically loaded in the copying machine body 10.

The length L (see FIG. 2) of the leading edge portion 27b of the leader sheet 27 with the positioning holes 27c formed in both ends thereof must be set at least to cover the distance from the reversing guide roller 17c to the pressing position between the paired pressure rollers 15a and 15b in order to transport the leading edge thereof to the pressing position between the paired pressure rollers 15a and 15b. When the leading edge of the leader sheet 27 reaches the point where it is pressed between the paired pressure rollers 15a and 15b, the leader sheet 27 is transported by means of the pressure exerted by the paired pressure rollers 15a and 15b. The trailing edge portion 27a which is the portion of the leader sheet 27 excluding the leading edge portion 27b has the enough rigidity to be transported, being led by the leading edge portion 27b of the leader sheet 27, by means of the pressure of the pressure rollers 15a and 15b. Positioning holes need not be formed in both sides of the trailing edge portion 27a, which therefore has the same width as that of the photosensitive sheet 21. The trailing edge portion 27a can of course be provided with the same width as that of the leading edge portion 27b, and positioning holes can be formed in both sides thereof. The leader sheet 27 passed between the pressure rollers 15a and 15b is transported to the take-up roller 28 in the photosensitive sheet cartridge 20, being guided by the transport roller 17g and transport guide 17h, to be taken up on the take-up roller 28. The length M of the trailing edge portion 27a of the leader sheet 27 is set in such a way that the entire length (L+M) of the leader sheet 27 at least covers the distance from the reversing guide roller 17c to the take-up roller 28. Moreover, if the length (L+M) of the leader sheet 27 is made longer than one turn of the rolled photosensitive sheet 21, protection of the photosensitive sheet 21 from exposure to light from outside the casing 22 is further ensured in the case of the leader sheet 27 having a light shielding property because the photosensitive sheet 21 accommodated in the casing 22 is covered by the leader sheet 27.

The guide protrusions 17f provided on both ends of the reversing guide roller 17c are disposed at the same spacing as that of the positioning holes 27c formed in the leading edge portion 27b of the leader sheet 27, each guide protrusion 17f being aligned with the corresponding protrusion on the other end. Each guide protrusion 17f is positioned to align with the corresponding protrusion on the other end with a maximum error of 100 μm with respect to the direction orthogonal to the sheet transporting direction. Therefore, the maximum misalignment of each side of the leader sheet 27 with respect to its transporting direction is kept at 200 μm, thus eliminating the possibility of transporting the photosensitive sheet 21 trailing behind leader sheet 27 at an angle that causes sheet jam during the image forming process. The positioning holes 27c formed in both ends of the leading edge portion 27b of the leader sheet 27, as well as the guide protrusions 17f, are provided at 3 to 5 mm intervals so that the misalignment of the positioning holes 27c with the guide protrusions 17f can be easily determined visually when engaging them with the guide protrusions 17f.

Since the leader sheet 27 has only to be provided with greater rigidity than the photosensitive sheet 21, the leader sheet 27 can be made from different material and produced separately from the photosensitive sheet 21 for connection with each other after produced as finished products. Therefore, the leader sheet 27 can be made for example of light shielding material as previously described to improve the storage life of the photosensitive sheet 21 by providing the photosensitive sheet 21 accommodated in the photosensitive sheet cartridge 20 with better protection from external light. Also, when producing the photosensitive sheet 21 to be connected to the leader sheet 27, sensitivity characteristic information of the produced photosensitive sheet 21 may be recorded so that adjustment of the image quality can be made by reading the recorded information during the auto loading. Furthermore, if a reference position mark is provided at the specified position on the leader sheet 27 when engaged with the guide protrusions 17f on the reversing guide roller 17c, the reference position mark being checked for misalignment during the auto loading of the photosensitive sheet 21, it is easy to check whether the photosensitive sheet is properly loaded.

Thus, with the photosensitive sheet cartridge 20 being mounted in the copying machine body 10, and with the photosensitive sheet 21 accommodated in the photosensitive sheet cartridge 20 being loaded in the copying machine body 10, the copying machine is operated for forming an image. The image forming operation of the copying machine proceeds as follows: The original placed on the original table 11 is scanned by the optical unit 12, the light reflected from the original being projected through the opening 17e of the guide plate 17d onto the photosensitive sheet 21 loaded in the copying machine body 10. This causes the microcapsules on the photosensitive sheet 21 to harden selectively, forming on the photosensitive sheet 21 a latent image corresponding to the original image. Thereafter, the photosensitive sheet 21 is transported by means of the reversing guide roller 17c to be fed between the paired pressure rollers 15a and 15b. At the same time, the image receiving sheet is fed from the paper cassette 41 or 42 whichever selected toward the pressing position between the paired pressure rollers 15a and 15b synchronously with the transportation of the photosensitive sheet 21, the microcapsule-coated surface of the photosensitive sheet 21 being superposed on the developer coated surface of the image receiving sheet for pressing between the paired pressure rollers 15a and 15b. This causes unhardened microcapsules on the photosensitive sheet 21 to rupture, the coloring materials contained in the microcapsules flowing out to react with the developer on the image receiving sheet. By the coloring materials developing the specified colors, an image corresponding to the original image is formed on the image receiving sheet.

The photosensitive sheet 21 passed between the paired pressure rollers 15a and 15b is guided by the transport roller 17g and transport guide 17h to be taken up on the take-up roller 28 in the photosensitive sheet cartridge 20. On the other hand, the image receiving sheet passed between the paired pressure rollers 15a and 15b is separated from the photosensitive sheet 21, and is transported to the image glossing unit 19b, which gives glossiness to the image on the image receiving sheet before discharging it to the paper exit tray 19c.

In this example, the leader sheet 27 is made to engage with the guide protrusions 17f on the reversing guide roller 17c, and with the sheet holding plate 18 pressing the leader sheet 27, the reversing guide roller 17c is made to rotate to automatically load the photosensitive sheet 21, but, alternatively, it can be so constructed that the photosensitive sheet 21 is loaded by manually rotating the reversing guide roller 17c.

EXAMPLE 2

Figure 4:
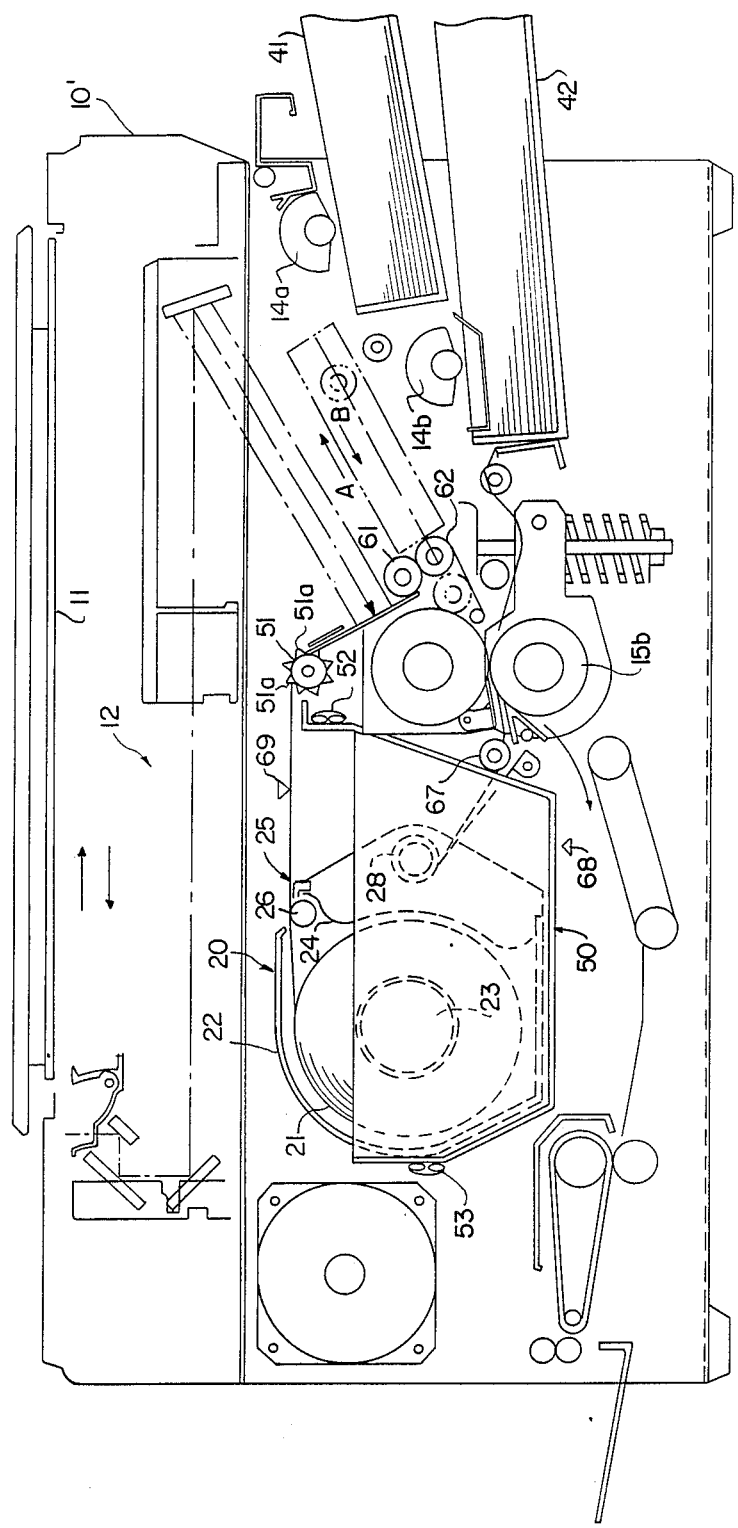
FIG. 4 is a schematic view showing another copying machine of the present invention.

FIG. 4 shows the construction of another copying machine of the present invention. The copying machine body 10' in this example uses a photosensitive sheet cartridge 20 of the same construction as the photosensitive sheet cartridge employed in Example 1. In the copying machine body 10', a lock mechanism using a solenoid for example is provided which prevents the rotation of the supply shaft 23. The lock mechanism works to prevent the supply shaft 23 from rotating, thus keeping the photosensitive sheet 21 and leader sheet 27 from being drawn out of the photosensitive sheet cartridge 20.

Figure 5:
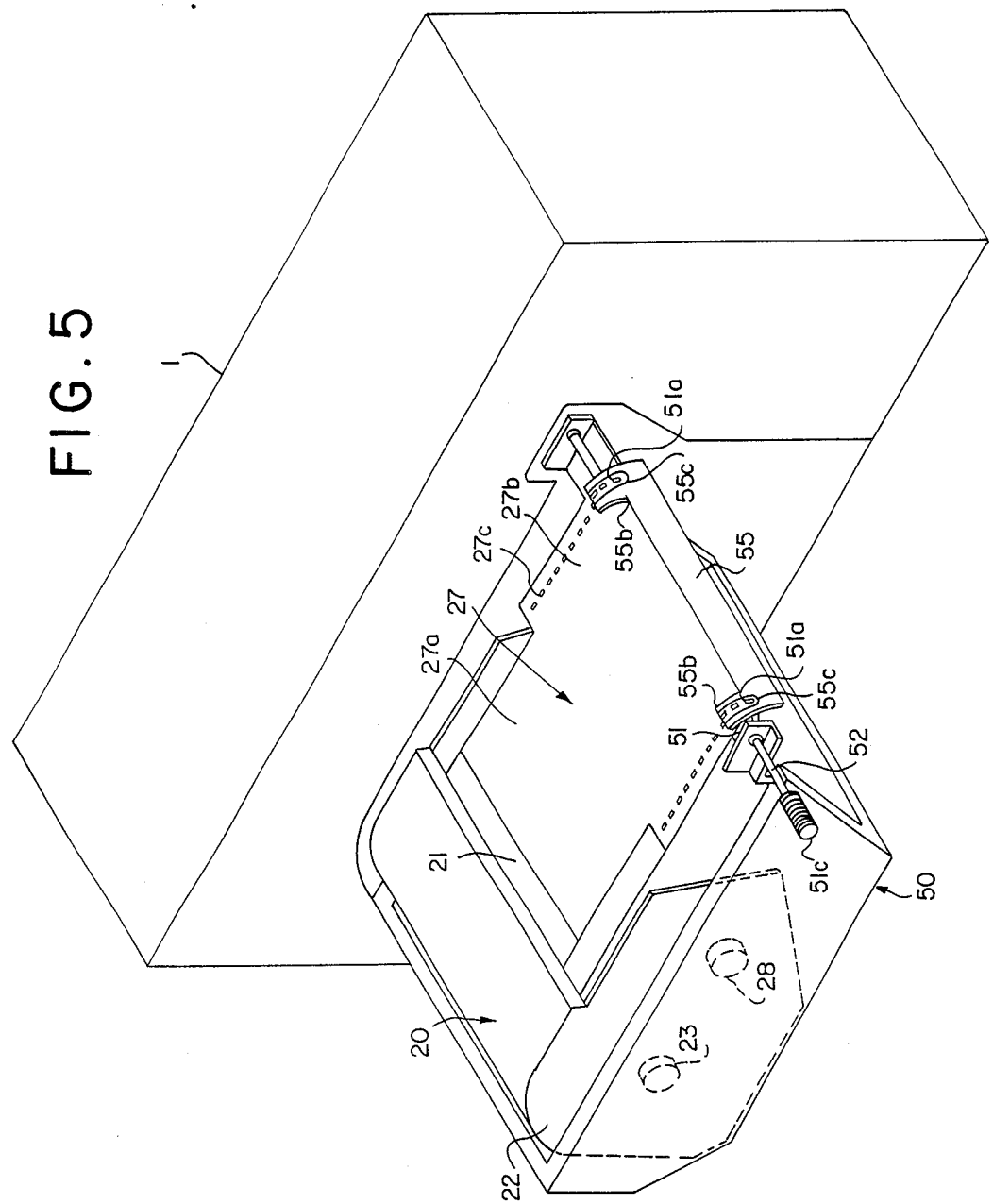
FIG. 5 is a perspective view showing a bucket slid out of the copying machine with a photosensitive sheet cartridge mounted in the bucket.

In the copying machine body 10', a bucket 50 is disposed by the side of the pressure roller 15a and in the position where the photosensitive sheet cartridge 20 is mounted. The bucket 50 is open at the top and at the side facing the pressure roller 15a, and the photosensitive sheet cartridge 20 is accommodated in the bucket 50. The bucket 50 has a slider 52 installed on the upper part of the open side facing the pressure roller 15a and extending in the crosswise direction, and a slider 53 (shown in FIG. 4) installed on the outer surface of the opposite side of the bucket 50 and extending also in the crosswise direction. With the front cover on the front side of the copying machine body 10' opened, the bucket 50 is drawn out in the horizontal position by sliding in the crosswise direction as shown in FIG. 5.

In the upper part of the side of the bucket 50 facing the pressure roller 15a, a guide roller 51 is rotatably installed. By drawing out the leader sheet 27 from the photosensitive sheet cartridge 20 accommodated in the bucket 50, the leader sheet 27 and the photosensitive sheet 21 are applied on the guide roller 51. Provided on both ends of the guide roller 51 are guide protrusions 51a which are continuously engaged with the positioning holes 21c formed in both sides of the leading edge portion 27b of the leader sheet 27. The guide protrusions 51a are positioned outwardly of the side edges of the photosensitive sheet 21 which is fed following the leader sheet 27. The roller shaft of the guide roller 51 extends behind the bucket 50, a gear (not shown) being attached to the extended portion. The gear engages with the gears provided in the copying machine body 10' when the bucket 50 is mounted in the copying machine body 10'. Power is transmitted via a clutch to the gears in the copying machine body 10' to drive the guide roller 51 for rotational motion. The roller shaft of the guide roller 51 also extends outwardly of the front of the bucket 50, a knob 51b being attached to the outwardly extended portion. With the bucket 50 drawn out to the front of the copying machine body 10', the guide roller 51 is made to rotate by rotating the knob 51b. The knob 51b is used to apply the leader sheet 27 on the guide roller 51 or when the photosensitive sheet 21 is jammed.

In the bucket 50, a sheet holding plate 55 is provided facing the guide roller 51. The sheet holding plate 55 is rotatably installed to allow movement toward and away from the guide roller 51. The end portions of the sheet holding plate 55 which face the positions of the guide protrusions 51a provided on the guide roller 51 are provided with pressing portions 55b and 55b respectively. Formed in each pressing portion 55b is a hole through which the guide protrusions 51a project when the sheet holding plate 55 is turned toward the guide roller 51. The pressing portions 55b press the sides of the leading edge portion 27b of the leader sheet 27 on the reversing guide roller 17c, the leader sheet 27 being transported with the positioning holes 27c engaged with the guide protrusions 51a.

Figure 7A:
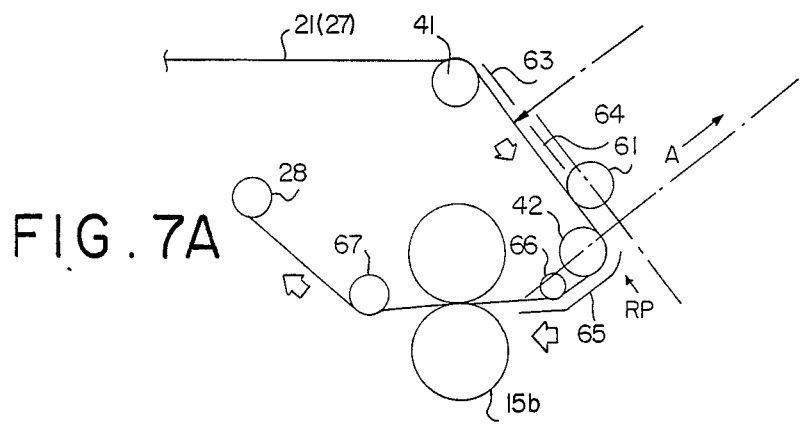
FIGS. 7A-7C are diagrams explaining the auto loading operation.

The bucket 50 is mounted in the copying machine body 10' with the positioning holes 27c in the sides of the leading edge portion 27b of the leader sheet 27 engaged with the guide protrusions 51a on the guide roller 51. When the bucket 50 is mounted in the copying machine body 10', the guide roller 51 runs to transport the leader sheet 27 engaged therewith along a transport guide 63 downward to the area where the light reflected from the original is projected through the optical unit 12. After passing that area, the leader sheet 27 is transported along a transport guide 64, and further downward along a guide roller 61 provided in the copying machine body 10', to be wound on a buffer roller 62 disposed under the guide roller 61. The buffer roller 62 is installed in a freely rotatable manner, the entire buffer roller 62 also being movable in the direction parallel with the guide roller 61. The buffer roller 62 is connected via a clutch to a buffer motor (not shown) capable of forward and reverse rotation for the parallel movement of the buffer roller 62, the buffer motor moving the buffer roller 62 in the direction (indicated by arrows A and B in FIG. 4) orthogonal to the transporting direction of the leader sheet 27 (i.e., the transporting direction of the photosensitive sheet 21). With a home position HP (see FIG. 7B) as the reference position where the buffer roller 62 is aligned with the guide roller 61 in the transporting direction of the photosensitive sheet 21, the buffer roller 62 is moved to a loading position RP (see FIG. 7A) which is closer to the pressure roller 15a from the home position by the diameter of the buffer roller, and to a transfer position TP (see FIG. 7C) which is farther from the home position HP in the direction opposite to the pressure roller 15a by a length slightly longer than the length of the photosensitive sheet 21 exposed to the light reflected from the original. As the buffer roller 62 is moved in the direction indicated by the arrow A, the photosensitive sheet 21 applied on the buffer roller 62 is further delivered through the delivery exit 25 of the photosensitive sheet cartridge 20. After the delivered photosensitive sheet 21 is exposed to the light reflected from the original, the buffer roller 62 is moved in the direction indicated by the arrow B to pass the exposed photosensitive sheet 21 between the pressure rollers 15a and 15b. At the home position HP is disposed a home position sensor (not shown) to detect the positioning of the buffer roller 62 at the home position HP, while at the loading position RP is disposed a loading sensor (not shown) to detect the positioning of the buffer roller 62 at the loading position.

The leader sheet 27, and thus the photosensitive sheet 21, applied on the buffer roller 62 is transported, being guided by a transport roller 66 and a transport guide 65, to the position between the paired pressure rollers 15a and 15b, and after passing between rollers 15a and 15c, is further transported, being guided by a transport roller 67, to be taken up on the take-up roller 28 in the photosensitive sheet cartridge 20.

In the copying machine of this example, a bucket sensor 68 for detecting the bucket 50 when set in the copying machine body 10' is disposed beneath the position where the bucket 50 is set in the copying machine body 10', while above the position where the bucket 50 is set is disposed a sheet sensor 69 for detecting the leader sheet 27 or the photosensitive sheet 21 which is delivered from the photosensitive sheet cartridge 20 accommodated in the bucket 50 in the copying machine body 10'.

Otherwise, the copying machine of this example has the same construction as the copying machine in Example 1.

In the copying machine of this example, the photosensitive sheet 21 accommodated in the photosensitive sheet cartridge 20 is loaded into the copying machine body 10' in the following manner. First, the front cover of the copying machine body 10' is opened, the bucket 50 is slid out of the copying machine body 10' in the horizontal position, and the photosensitive sheet cartridge 20 is mounted in the bucket 50. Next, the leading edge portion 27b of the leader sheet 27 is drawn out through the delivery exit 25 of the photosensitive sheet cartridge 20. At this point of time, the sheet holding plate 55 disposed facing the guide roller 51 is turned in the direction away from the guide roller 51. With this state, the positioning holes 27c in both sides of the leading edge portion 27b of the leader sheet 27 are engaged with the guide protrusions 51a on the guide roller 51, and then the sheet holding plate 55 is turned toward the guide roller 51 to engage the holes 55c formed in the pressing portions 55b of the sheet holding plate 55 with the guide protrusions 51a, thus pressing both sides of the leading edge portion 27b of the leader sheet 27 by the pressing portions 55b. Thereafter, the bucket 50 is set in the copying machine body 10' by sliding it into the copying machine body 10'.

Figure 6A:
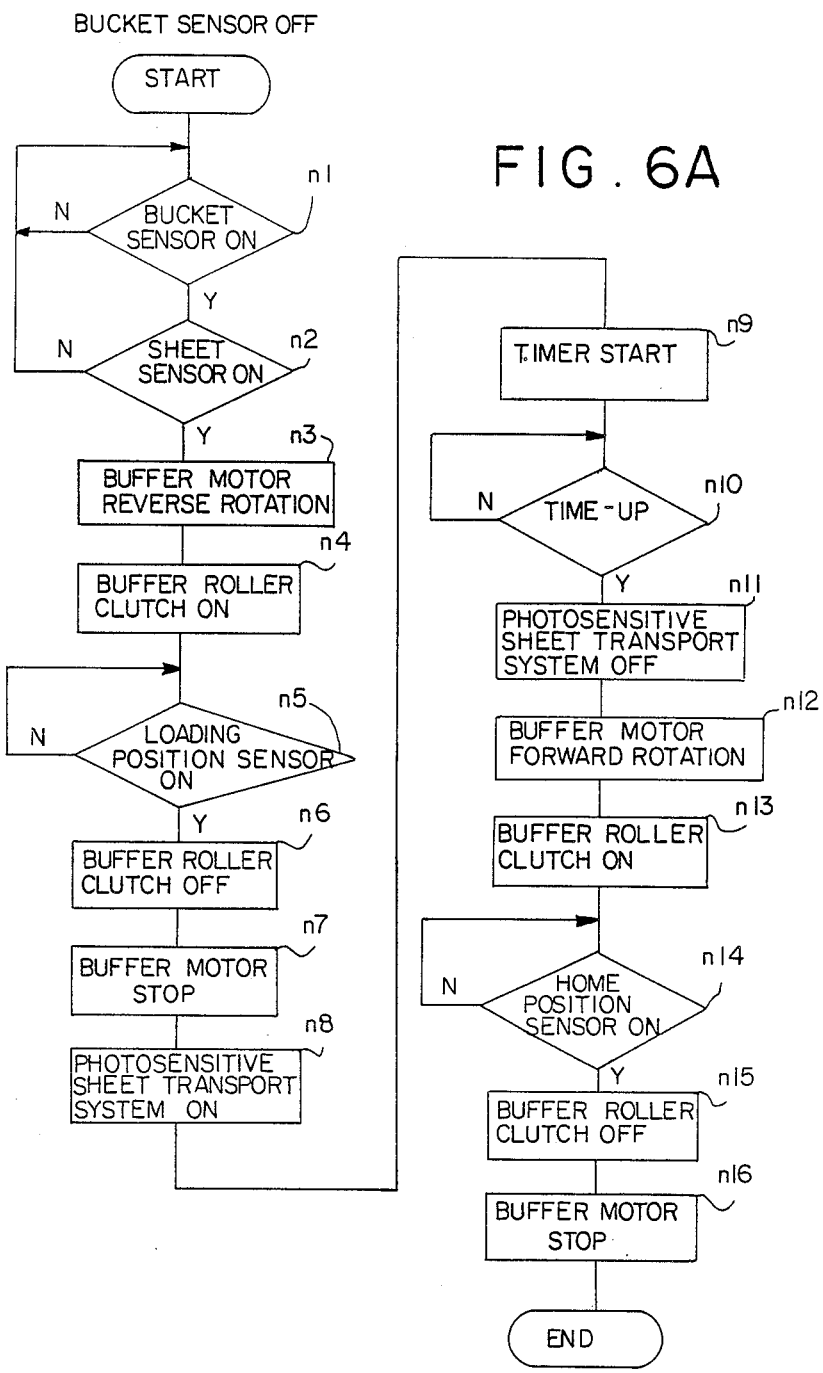
FIG. 6A is a flowchart explaining the auto loading operation of the copying machine of FIG. 4.

With the above operation completed, the copying machine body 10' starts auto loading of the photosensitive sheet 21 into the copying machine body 10'. Referring to the flowchart of the FIG. 6A to explain the auto loading operation, setting the bucket 50 in the copying machine body 10' activates the bucket sensor 68 (n1), and the sheet sensor 69 is activated by detecting the leader sheet 27 which is delivered from the photosensitive sheet cartridge 20 accommodated in the bucket 50 (n2), which causes the buffer motor to rotate in the reverse direction (n3), and then the buffer roller clutch to engage. At this point of time, the buffer roller 62 which is positioned at first at the home position HP is moved in the direction indicated by the arrow A in FIG. 4 to the loading position RP in FIG. 7A as the buffer motor rotate in the reverse direction and the buffer roller clutch engages. When the buffer roller 62 reaches the loading position RP to activate the loading position sensor, the buffer roller clutch disengages (n6), while at the same time the buffer motor is stopped (n7) to stop the moving of the buffer roller 62. When the buffer roller 62 is positioned at the loading position, the photosensitive sheet transport system consisting of the guide roller 51, the buffer roller 62, and the pressure rollers 15a and 15b is driven by a rotational motion (n8), while at the same time the timer is activated (n9). As a result, the leader sheet 27 is transported straight along the transport guides 63 and 64 and in contact with the rotating surface of the guide roller 61, is then applied on the buffer roller 62, being guided by the transport guide 65, and is further transported on the transport roller 67 to be taken up on the take-up roller 28 in the photosensitive sheet cartridge 20. The timer has a preset time that is equal to the time needed for the leader sheet 27 to travel from the guide roller 51 to the take-up roller 28, and trips at the end of the preset time (n10), de-energizing the photosensitive sheet transport system consisting of the guide roller 51, the buffer roller 62, and the pressure rollers 15a and 15b (n11), thus stopping the rotation of these rollers. Since the leader sheet 27 is transported from the guide roller 61 to the buffer roller 62 in a straightened state, there is no possibility of the leader sheet 27 jamming. Since the leader sheet 27 is provided with a length which at least covers the distance from the buffer roller 62 to the pressing position between the paired pressure rollers 15a and 15b, the photosensitive sheet 21 led by the leader sheet 27 is applied on the guide roller 51 and the buffer roller 62 when the leading edge of the leader sheet 27 is taken up on the take-up roller 28 in the photosensitive sheet cartridge 20. Thereafter, the buffer motor is driven for forward rotation (n12), while at the same time engaging the buffer roller clutch (n13), thus moving the buffer roller 62 to the home position HP. When the buffer roller 62 is positioned at the home position HP, the home position sensor is activated (n14), disengaging the buffer roller clutch (n15), and stopping the buffer motor (n16). Thus, the photosensitive sheet 21 is loaded, being applied on the guide roller 61 and the buffer roller 62.

The auto loading as described above is also performed when a fresh photosensitive sheet cartridge is mounted to replace the photosensitive sheet cartridge 20 after the photosensitive sheet 21 in the photosensitive sheet cartridge 20 is used up.

Figure 6B:
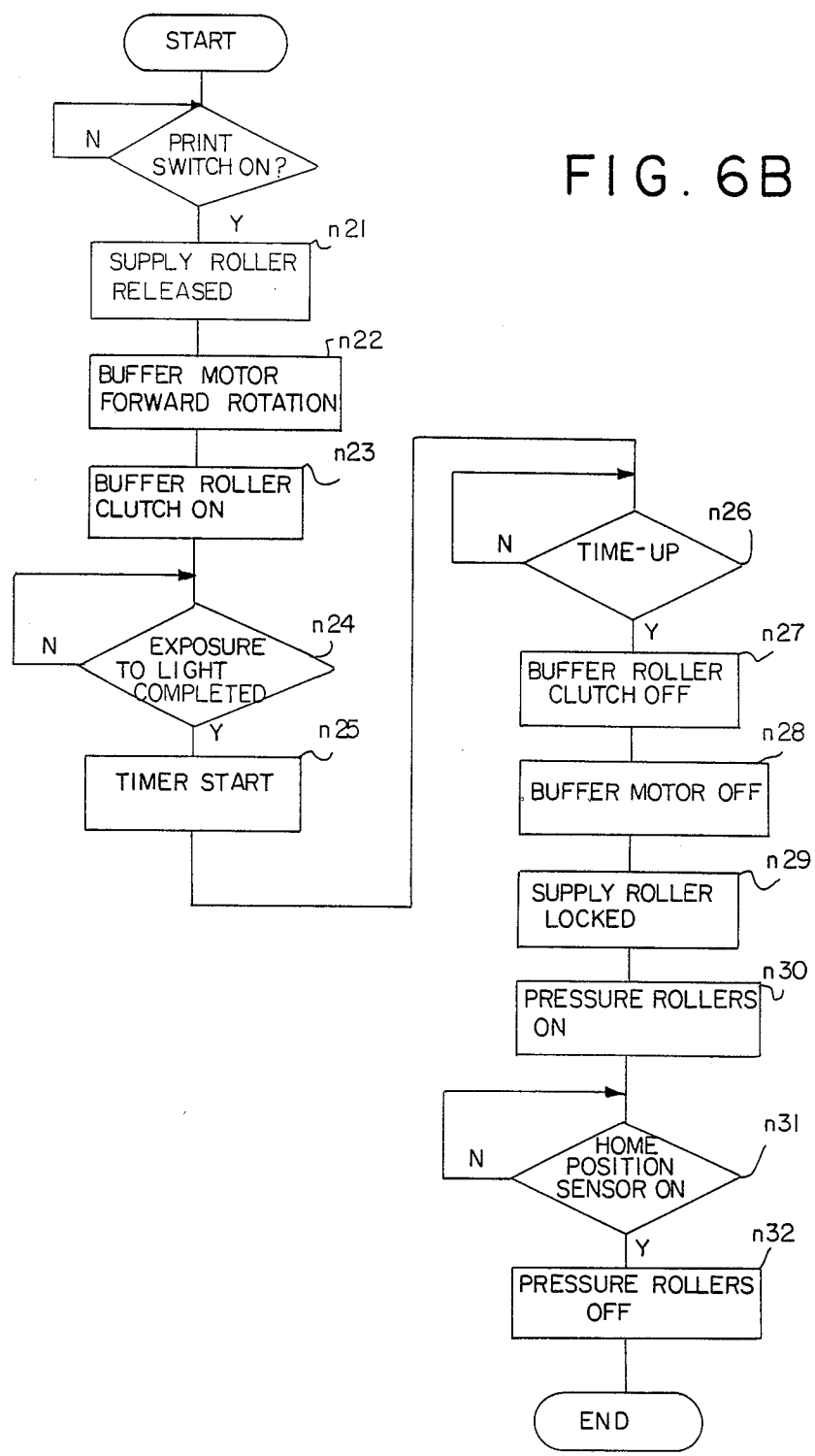
FIG. 6B is a flowchart explaining the copying operation of the copying machine of FIG. 4.
Figure 7B:
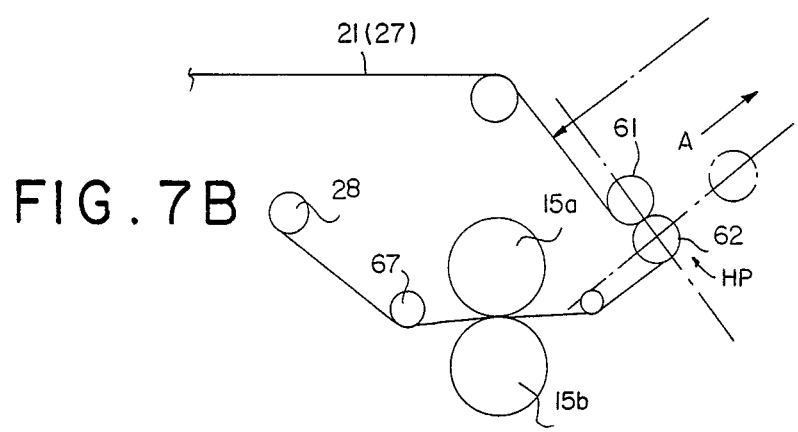

The following describes the image forming operation of the copying machine of this example with reference to the flowchart of FIG. 6B. With an original placed on the original table 11 for forming a copy image, when the print switch is turned on, the lock mechanism of the supply shaft 23 in the photosensitive sheet cartridge 20 is released (n21), the buffer motor starts to rotate in the forward direction (n22), the buffer roller clutch engages (n23), and the buffer roller 62 which is positioned at the home position HP is moved to the transfer position TP. As the buffer roller is moved toward the transfer position TP, the photosensitive sheet 21 applied on the guide roller 61 and buffer roller 62 is delivered from the photosensitive sheet cartridge 20, being pulled by the buffer roller 62. At this time, the optical unit 12 scans the original on the original table 11, the light reflected therefrom being projected onto the photosensitive sheet 21 positioned between the guide roller 51 and the guide roller 61, as shown in FIG. 7B. While the buffer roller 62 is moved in the direction indicated by the arrow A in FIG. 7B, the photosensitive sheet 21 is continuously transported through the position between the guide roller 51 and the guide roller 61 for exposure to the light reflected from the original, thereby causing the microcapsules on the photosensitive sheet 21 to harden selectively. As a result, a latent image corresponding to the original image is formed on the photosensitive sheet. Since the photosensitive sheet 21 is transported at a stable traveling speed half that of the buffer roller 62, a latent image corresponding to the original image is formed on the photosensitive sheet 21 in a stable condition.

Figure 7C:
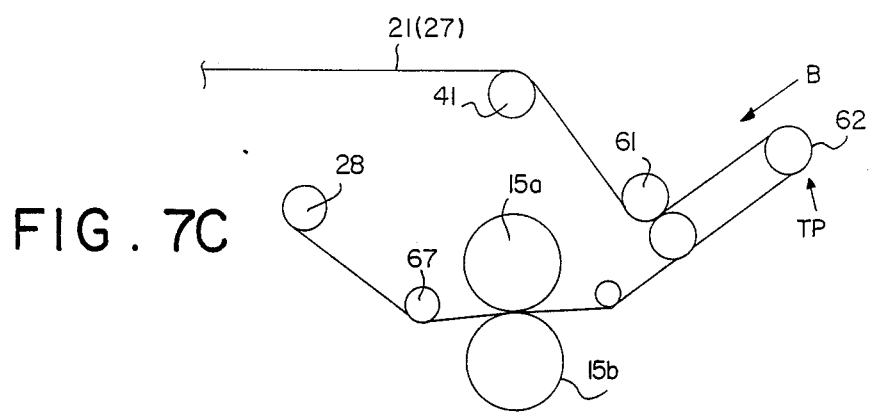

When the scanning of the original by the optical unit 12 is completed (n24), the timer starts to count time (n25). The timer counts the time needed to transport the photosensitive sheet 21 by the length slightly longer than that of the photosensitive sheet 21 exposed to the light reflected from the original so as to ensure that the exposed photosensitive sheet 21 passes between the pressure rollers 15a and 15b through to the trailing edge thereof. When the timer trips (n26), the buffer roller clutch disengages (n27), while at the same time the buffer motor is de-energized (n28), the buffer roller 62 now positioning at the transfer position TP as shown in FIG. 7C. At this time, the supply shaft 23 in the photosensitive sheet cartridge 20 is locked (n29).

With the above operation completed, the paired pressure rollers 15a and 15b are driven for rotational motion synchronously with the transporting timing of the image receiving sheet delivered from the paper cassette 41 or 42 (n30). At this time, the buffer motor used to travel the buffer roller 62 is in a freely rotatable state, and as the photosensitive sheet 21 is passed between the paired pressure rollers 15a and 15b by the rotational motion of the pressure rollers 15a and 15b, the buffer roller 62 being pulled by the photosensitive sheet 21 continuously travels from the transfer position TP toward the home position HP, the exposed area of the photosensitive sheet 21 where a latent image is formed being continuously passed, with the image receiving sheet superposed thereon, between the paired pressure rollers 15a and 15b. As a result, the unhardened microcapsules on the area of the photosensitive sheet 21 where the latent image is formed are caused to rupture by the pressure between the paired pressure rollers 15a and 15b, which causes the coloring materials contained in the microcapsules to flow out on the image receiving sheet, the coloring material then reacting with the developer on the image receiving sheet to develop colors, resulting in an image corresponding to the original image.

By the time the exposed area of the photosensitive sheet 21 where the latent image is formed and the image receiving sheet superposed thereon have completely passed between the paired pressure rollers 15a and 15b, the buffer roller 62 reaches the home position sensor HP, activating the home position sensor (n31). As a result, the paired pressure rollers 15a and 15b stop rotating (n32).

In this example, only the guide roller 51 is installed on the bucket 50, but other rollers including the guide roller 61 and the transport rollers 66 and 67, as well as the guide roller 51 can also be installed on the bucket 50. The home position HP of the buffer roller 62 does not necessarily have to be provided precisely at the position downstream of the guide roller 61 in the transporting direction of the photosensitive sheet, but can be set at a position farther away from the pressure roller 15a. In this case also, when the buffer roller 62 is made to travel in the direction opposite to the pressure roller 15a, the photosensitive sheet 21 is drawn out of the photosensitive sheet cartridge 20 at a stable travelling speed half that of the buffer roller 62.

EXAMPLE 3

Figure 8:
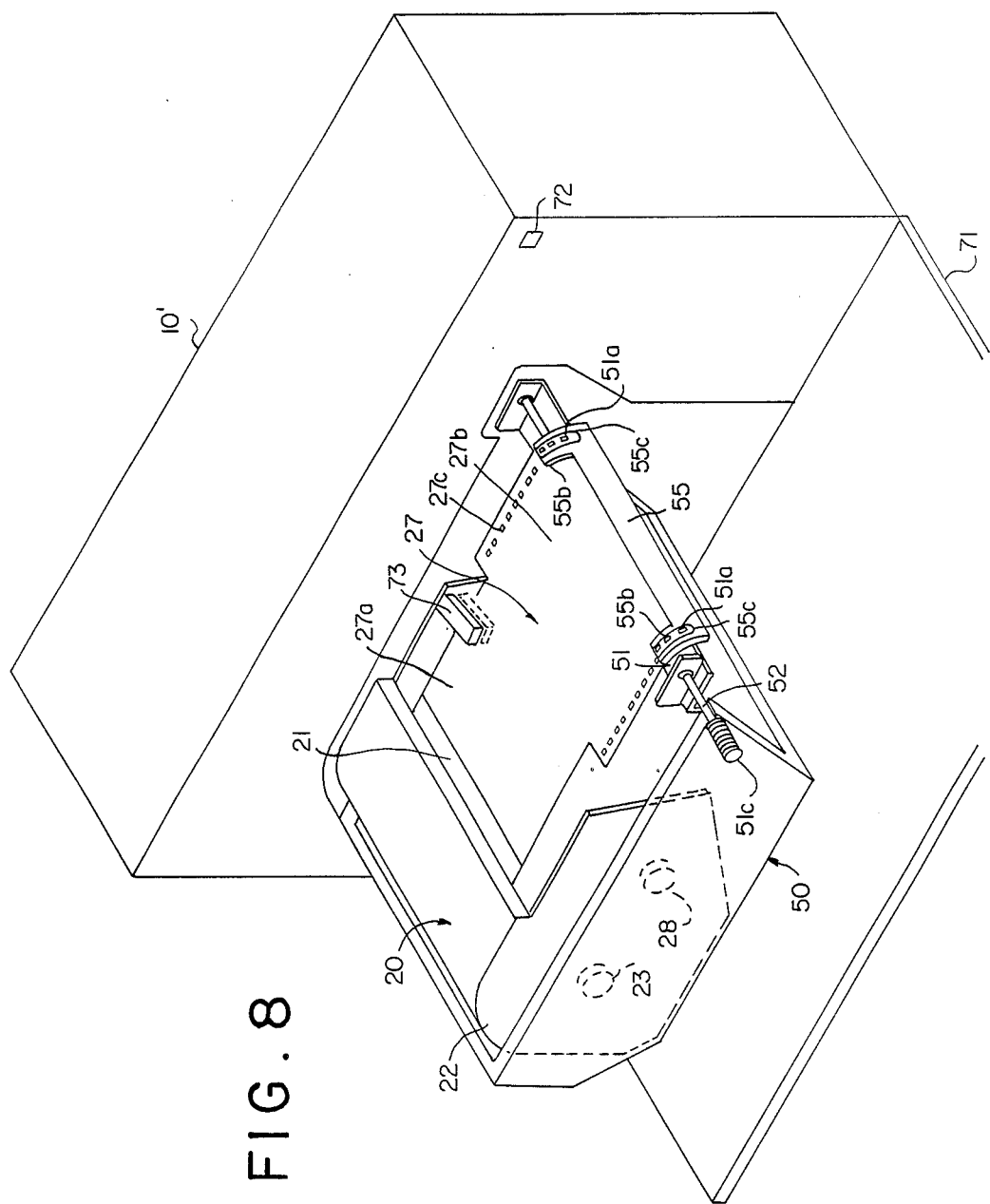
FIG. 8 is a perspective view showing a bucket slid out of another copying machine of the present invention with a photoconductor sheet cartridge mounted in the bucket.

In the copying machine of this example, as shown in FIG. 8, a front cover sensor 72 for detecting the closed state of the front cover 71 which is opened to slide out the bucket 50 from the copying machine body 10' is disposed in an upper corner on the front of the copying machine body 10', while a sheet sensor 73 for detecting the leader sheet 27 or the photosensitive sheet 21 delivered from the photosensitive sheet cartridge 20 in the bucket 50 is disposed inside the bucket. Unlike the copying machine of Example 2, the copying machine of this example is not provided with a sensor for detecting the bucket 50 set in the copying machine body 10'. Otherwise, the construction is the same as that of the copying machine of Example 2.

Figure 9:
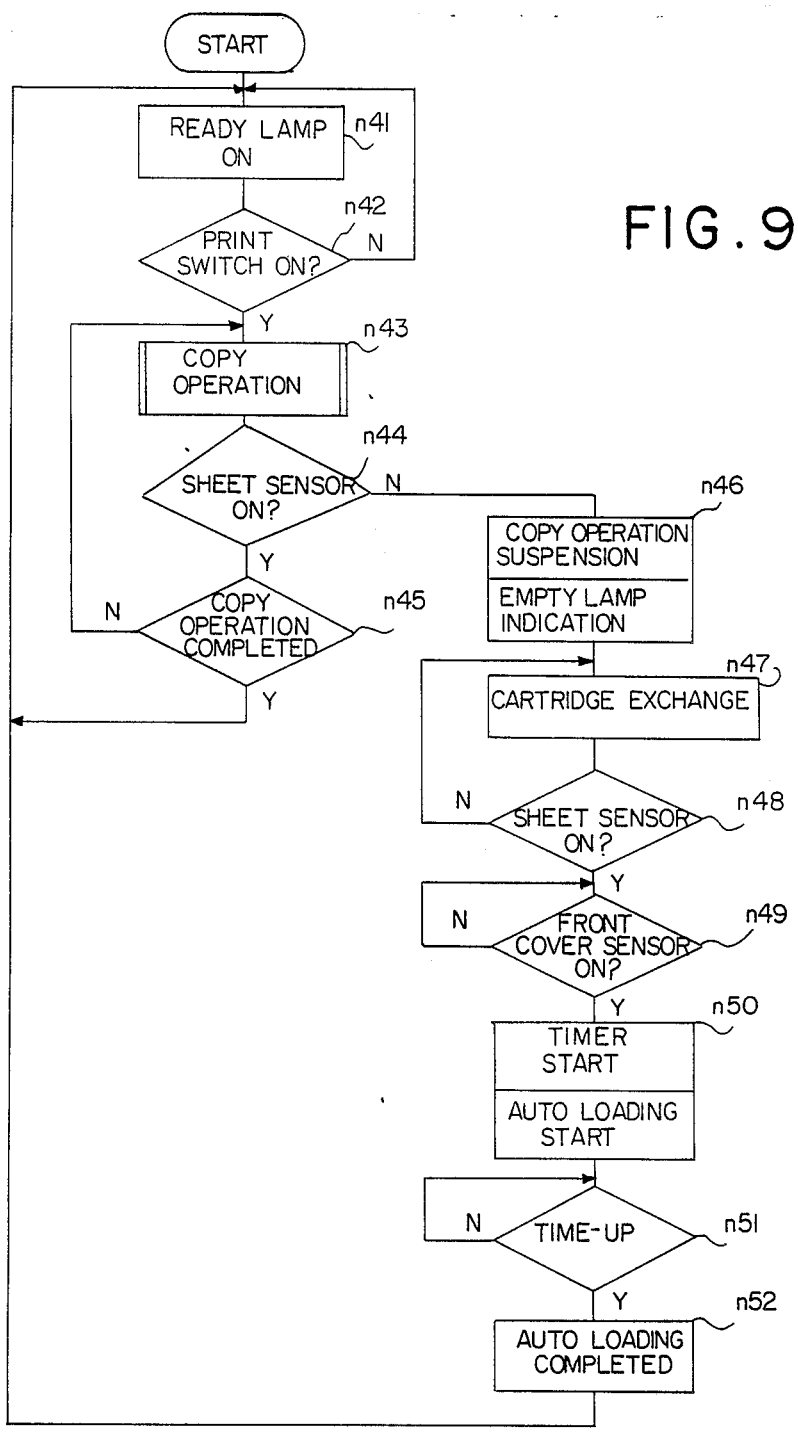
FIG. 9 is a flowchart explaining the auto loading operation of the copying machine of FIG. 8.

Auto loading of the photosensitive sheet 21 in the copying machine body 10' is performed based on the results of detection by the front cover sensor 72 and the sheet sensor 73. Referring to the flowchart of FIG. 9, the following describes the auto loading operation when the photosensitive sheet cartridge 20 is changed.

In the same way as in the case of the copying machine of Example 2 mentioned above, when the copying machine gets ready for copy operation with the photosensitive sheet cartridge 20 mounted and the photosensitive sheet loaded therein, the ready lamp (not shown) disposed on the top surface of the copying machine body 10' is illuminated (n41). With the ready lamp illuminated, when the print switch is turned on (n42), the copy operation is performed in the prescribed sequence (n43). The same copy operation as that of Example 2 is performed.

If the photosensitive sheet 21 is set in the photosensitive sheet cartridge 20 with the sheet sensor 73 activated in the presence of the photosensitive sheet 21 (n44), the copy operation continues till it is completed (n45). When the copy operation is completed, the ready lamp remains on for the next copy operation. If the photosensitive sheet runs out during the copy operation, the sheet sensor 73 is de-activated, suspending the copy operation and illuminating the sheet empty lamp indicating that the photosensitive sheet has run out (n46).

When the sheet empty lamp is illuminated, the front cover 71 of the copying machine body 10' is opened to slide out the bucket 50 from the copying machine body 10'. Then, the photosensitive sheet cartridge 20 empty of the photosensitive sheet 21 is removed from the bucket 50, and a fresh photosensitive sheet cartridge 20 is mounted in the bucket 50 (n47). Then, in the same way as in the case of Example 2, the leader sheet 27 is drawn out of the photosensitive sheet cartridge 20, and is engaged with the guide roller 51. As a result, the sheet sensor 73 is activated by detecting the leader sheet 27 (n48). With this state, when the bucket 50 is set in the copying machine body 10' and the front cover 71 is closed, the front cover sensor is activated (n49), while at the same time the timer is activated, and the auto loading is started (n50). The auto loading is performed in the same manner as in the case of the copying machine of Example 2. The timer counts the time needed for the auto loading, and trips at the end of the preset time for the auto loading (n51), thus completing the auto loading operation (n52). As a result, the photosensitive sheet 21 is loaded in the copying machine body 10'. When the print switch is turned on, the copy operation is started again.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An image forming apparatus in which a photosensitive sheet coated with microcapsules containing photohardening materials and coloring dyes is exposed to light from the original image and then pressed, with an image receiving sheet coated with developer, between a pair of pressure rollers, resulting in an image on said image forming sheet, comprising:

a photosensitive sheet cartridge in which said photosensitive sheet is accommodated in a rolled form, a leader sheet being connected to the leading edge of said photosensitive sheet and numerous positioning holes being provided at regular intervals on both sides of said leader sheet in the longitudinal direction of said photosensitive sheet, the body of said image forming apparatus onto which said photosensitive sheet cartridge is detachably mounted, and a guide roller for transporting said photosensitive sheet, which is drawn from said photosensitive sheet cartridge, toward said pair of pressure rollers when said cartridge is installed into the body of said image forming apparatus, said guide being provided with guide protrusions, at regular intervals on the outer surface thereof, which engage with said positioning holes of said leader sheet.

2. An image forming apparatus according to claim 1, wherein said leader sheet has a greater rigidity than said photosensitive sheet.

3. An image forming apparatus according to claim 1, wherein a sheet holding means is disposed facing said guide roller so as to be moved to engage with and disengage from said guide roller, said sheet holding means acting to press on said guide roller said leader sheet, the positioning holes of which are engaged with said guide protrusions of said guide roller, when said sheet holding means is moved toward said guide roller.

4. An image forming apparatus according to claim 1, wherein a bucket where said photosensitive sheet cartridge is mounted is disposed in the body of said image forming apparatus so that it is drawn from and installed into the body of said image forming apparatus in the horizontal position.

5. An image forming apparatus according to claim 4, wherein said bucket is drawn from the body of said image forming apparatus by opening a cover provided on one side of the body of said image forming apparatus.

6. An image forming apparatus according to claim 4, wherein said guide roller is disposed in said bucket.

7. An image forming apparatus according to claim 1, wherein the body of said image forming apparatus comprises an auto loading means by which said leader sheet, the positioning holes of which are engaged with the guide protrusions of said guide roller, is transported toward said pair of pressure rollers so as to achieve an auto loading of said photosensitive sheet into the body of said image forming apparatus.

8. An image forming apparatus according to claim 4, wherein said auto loading means operates at the time when it is detected that not only said bucket has been set into the body of said image forming apparatus but that said photosensitive sheet cartridge has been set into said bucket.

9. An image forming apparatus according to claim 5, wherein said auto loading means operates at the time when it is detected that not only said cover has been closed but that said photosensitive sheet cartridge has been set into said bucket.

* * * * *